(12) United States Patent
Bunker et al.

(10) Patent No.: US 8,387,245 B2
(45) Date of Patent: Mar. 5, 2013

(54) COMPONENTS WITH RE-ENTRANT SHAPED COOLING CHANNELS AND METHODS OF MANUFACTURE

(75) Inventors: Ronald Scott Bunker, Waterford, NY (US); Bin Wei, Mechanicville, NY (US); Mitchell Nile Hammond, Amsterdam, NY (US)

(73) Assignee: General Electric Company, Niskayuna, NY (US)

( * ) Notice: Subject to any disclaimer, the term of this patent is extended or adjusted under 35 U.S.C. 154(b) by 205 days.

(21) Appl. No.: 12/943,624

(22) Filed: Nov. 10, 2010

(65) Prior Publication Data
US 2012/0111545 A1    May 10, 2012

(51) Int. Cl.
*B23P 15/02*    (2006.01)
(52) U.S. Cl. ............ 29/889.721; 29/889.72; 416/236 R; 416/223 R
(58) Field of Classification Search .................. 29/889.7, 29/889.72, 889.721, 889.722; 416/223 R, 416/235, 236 R
See application file for complete search history.

(56) References Cited

U.S. PATENT DOCUMENTS

| | | | |
|---|---|---|---|
| 4,042,162 A * | 8/1977 | Meginnis et al. ............ 228/106 |
| 5,626,462 A | 5/1997 | Jackson et al. | |
| 5,640,767 A * | 6/1997 | Jackson et al. ............ 29/889.721 |
| 5,875,549 A * | 3/1999 | McKinley ................... 29/889.2 |
| 6,086,328 A * | 7/2000 | Lee ............................ 416/97 R |
| 6,214,248 B1 * | 4/2001 | Browning et al. ............. 216/56 |
| 6,234,755 B1 | 5/2001 | Bunker et al. | |
| 6,238,183 B1 * | 5/2001 | Williamson et al. ........ 416/96 A |
| 6,321,449 B2 | 11/2001 | Zhao et al. | |
| 6,368,060 B1 | 4/2002 | Fehrenbach et al. | |
| 6,375,425 B1 * | 4/2002 | Lee et al. .................... 416/97 R |
| 6,412,541 B2 | 7/2002 | Roesler et al. | |
| 6,551,061 B2 | 4/2003 | Darolia et al. | |
| 6,582,194 B1 | 6/2003 | Birkner et al. | |

(Continued)

FOREIGN PATENT DOCUMENTS
EP    1387040 B1    6/2006

OTHER PUBLICATIONS

D. G. Hyams et al., "A Detailed Analysis of Film Cooling Physics: Part III—Streamwise Injection With Shaped Holes," Journal of Turbomachinery, vol. 122, Issue 1, Jan. 2000, pp. 122-132.

(Continued)

*Primary Examiner* — David Bryant
*Assistant Examiner* — Jacob Cigna
(74) *Attorney, Agent, or Firm* — Penny A. Clarke

(57) ABSTRACT

A method of fabricating a component is provided. The method includes forming one or more grooves in a surface of a substrate, where the substrate has at least one hollow interior space. Each of the one or more grooves extends at least partially along the substrate surface and has a base and a top. The base is wider than the top, such that each of the one or more grooves comprises a re-entrant shaped groove. The method further includes forming one or more access holes through the base of a respective groove, to connect the groove in fluid communication with respective ones of the hollow interior space(s), and disposing a coating over at least a portion of the substrate surface. The one or more grooves and coating define one or more re-entrant shaped channels for cooling the component. A component with one or more re-entrant shaped channels and a method of coating a component are also provided.

16 Claims, 5 Drawing Sheets

U.S. PATENT DOCUMENTS

| | | | |
|---|---|---|---|
| 6,602,053 | B2 | 8/2003 | Subramanian et al. |
| 6,617,003 | B1 | 9/2003 | Lee et al. |
| 6,905,302 | B2 | 6/2005 | Lee et al. |
| 6,921,014 | B2 | 7/2005 | Hasz et al. |
| 7,014,923 | B2 | 3/2006 | Schnell et al. |
| 7,094,475 | B2 | 8/2006 | Schnell et al. |
| 7,186,091 | B2 * | 3/2007 | Lee et al. ............ 416/231 R |
| 7,186,167 | B2 | 3/2007 | Joslin |
| 7,247,002 | B2 * | 7/2007 | Albrecht et al. ............ 416/224 |
| 7,302,990 | B2 * | 12/2007 | Bunker et al. ............ 164/28 |
| 7,744,348 | B2 * | 6/2010 | Bezencon et al. ............ 416/97 R |
| 2010/0080688 | A1 * | 4/2010 | Bezencon et al. ............ 415/115 |

OTHER PUBLICATIONS

B. Wei et al., "Curved Electrode and Electrochemical Machining Method and Assembly Employing the Same," U.S. Appl. No. 12/562,568, filed Sep. 18, 2009.

W. Zhang et al., Process and System for Forming Shaped Air Holes, U.S. Appl. No. 12/697,005, filed Jan. 29, 2010.

B. P. Lacy et al., "Hot Gas Path Component Cooling System," U.S. Appl. No. 12/765,372, filed Apr. 22, 2010.

B. Lacy et al., "Articles Which Include Chevron Film Cooling Holes, and Related Processes," U.S. Appl. No. 12/690,675, filed May 28, 2010.

J.E.J. Lambie et al., "An overview on micro-meso manufacturing techniques for micro-heat exchangers for turbine blade cooling," International Journal Manufacturing Research, vol. 3, No. 1, 2008, pp. 3-26.

B.P. Lacy et al., "Hot Gas Path Component Cooling System," U.S. Appl. No. 12/765,372, filed Apr. 22, 2010.

R.S. Bunker et al., "Turbine Components With Cooling Features and Methods of Manufacturing the Same," U.S. Appl. No. 12/953,177, filed Nov. 23, 2010.

* cited by examiner

COMPONENTS WITH RE-ENTRANT SHAPED COOLING CHANNELS AND METHODS OF MANUFACTURE

BACKGROUND

The invention relates generally to gas turbine engines, and, more specifically, to micro-channel cooling therein.

In a gas turbine engine, air is pressurized in a compressor and mixed with fuel in a combustor for generating hot combustion gases. Energy is extracted from the gases in a high pressure turbine (HPT), which powers the compressor, and in a low pressure turbine (LPT), which powers a fan in a turbofan aircraft engine application, or powers an external shaft for marine and industrial applications.

Engine efficiency increases with temperature of combustion gases. However, the combustion gases heat the various components along their flowpath, which in turn requires cooling thereof to achieve a long engine lifetime. Typically, the hot gas path components are cooled by bleeding air from the compressor. This cooling process reduces engine efficiency, as the bled air is not used in the combustion process.

Gas turbine engine cooling art is mature and includes numerous patents for various aspects of cooling circuits and features in the various hot gas path components. For example, the combustor includes radially outer and inner liners, which require cooling during operation. Turbine nozzles include hollow vanes supported between outer and inner bands, which also require cooling. Turbine rotor blades are hollow and typically include cooling circuits therein, with the blades being surrounded by turbine shrouds, which also require cooling. The hot combustion gases are discharged through an exhaust which may also be lined, and suitably cooled.

In all of these exemplary gas turbine engine components, thin metal walls of high strength superalloy metals are typically used for enhanced durability while minimizing the need for cooling thereof. Various cooling circuits and features are tailored for these individual components in their corresponding environments in the engine. For example, a series of internal cooling passages, or serpentines, may be formed in a hot gas path component. A cooling fluid may be provided to the serpentines from a plenum, and the cooling fluid may flow through the passages, cooling the hot gas path component substrate and coatings. However, this cooling strategy typically results in comparatively low heat transfer rates and non-uniform component temperature profiles.

Micro-channel cooling has the potential to significantly reduce cooling requirements by placing the cooling as close as possible to the heat zone, thus reducing the temperature difference between the hot side and cold side for a given heat transfer rate. However, current techniques for forming microchannels typically require the use of a sacrificial filler to keep the coating from being deposited within the microchannels, to support the coating during deposition, as well as the removal of the sacrificial filler after deposition of the coating system. However, both the filling of the channels with a fugitive material, and the later removal of that material present potential problems for current micro-channel processing techniques. For example, the filler must be compatible with the substrate and coatings, yet have minimal shrinkage, but also have sufficient strength. Removal of the sacrificial filler involves potentially damaging processes of leaching, etching, or vaporization, and typically requires long times. Residual filler material is also a concern.

It would therefore be desirable to provide a method for forming cooling channels in hot gas path components that eliminates the need for the filling and removal processes.

BRIEF DESCRIPTION OF THE INVENTION

One aspect of the present invention resides in a method of fabricating a component. The method includes forming one or more grooves in a surface of a substrate, where the substrate has at least one hollow interior space. Each of the one or more grooves extends at least partially along the surface of the substrate and has a base and a top. The base is wider than the top, such that each of the one or more grooves comprises a re-entrant shaped groove. The method further includes forming one or more access holes through the base of a respective one of the one or more grooves, to connect the groove in fluid communication with respective ones of the hollow interior space(s). The method further includes disposing a coating over at least a portion of the surface of the substrate, where the one or more grooves and the coating define one or more re-entrant shaped channels for cooling the component.

Another aspect of the invention resides in a component that includes a substrate comprising an outer surface and an inner surface. The inner surface defines at least one hollow, interior space, and the outer surface defines one or more grooves. Each of the one or more grooves extends at least partially along the surface of the substrate and has a base and a top. The base is wider than the top, such that each of the one or more grooves comprises a re-entrant shaped groove. One (or more) access holes is (are) formed through the base of a respective groove, to connect the groove in fluid communication with respective ones of the at least one hollow interior space. The component further includes at least one coating disposed over at least a portion of the surface of the substrate. The one or more grooves and the coating define one or more re-entrant shaped channels for cooling the component.

Yet another aspect of the invention resides in a method of coating a component without the use of a sacrificial filler. The method includes forming one or more grooves in a surface of a substrate, where the substrate has at least one hollow interior space. Each of the one or more grooves extends at least partially along the surface of the substrate and has a base and a top, where the top is about 0.1 mm to 0.5 mm in width. The method further includes disposing a coating over at least a portion of the surface of the substrate directly over open ones of the one or more grooves, where the one or more grooves and the coating define one or more channels for cooling the component.

DRAWINGS

These and other features, aspects, and advantages of the present invention will become better understood when the following detailed description is read with reference to the accompanying drawings in which like characters represent like parts throughout the drawings, wherein.

Figure 7:
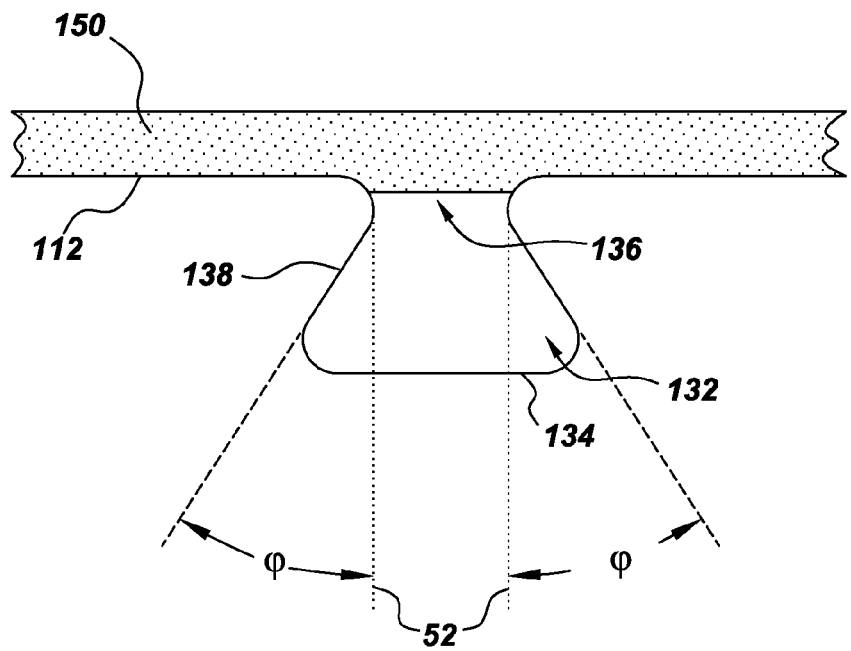
Figure 8:
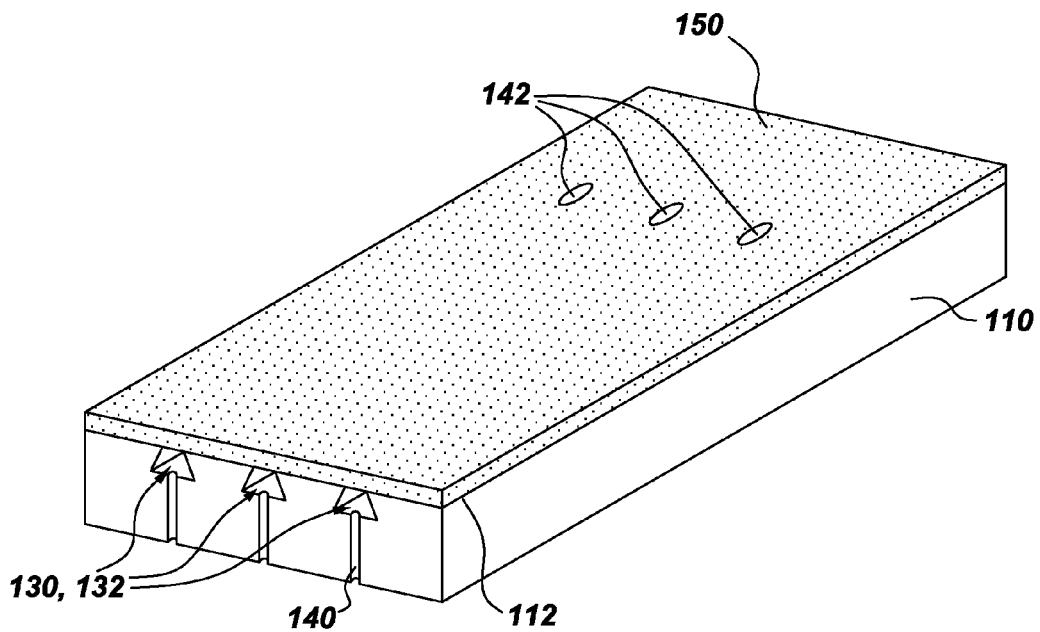
Figure 9:
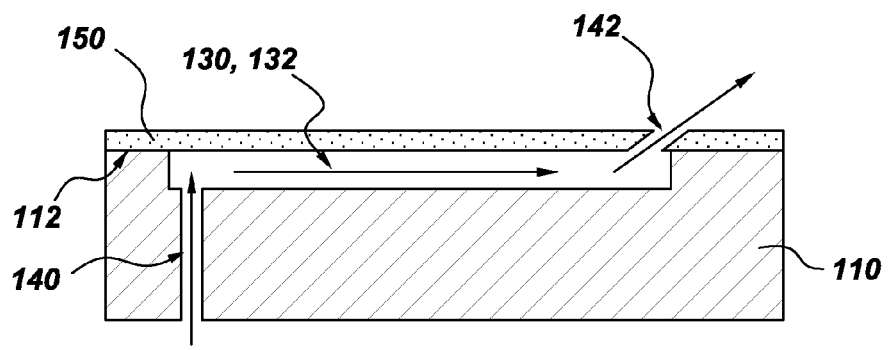
Figure 10:
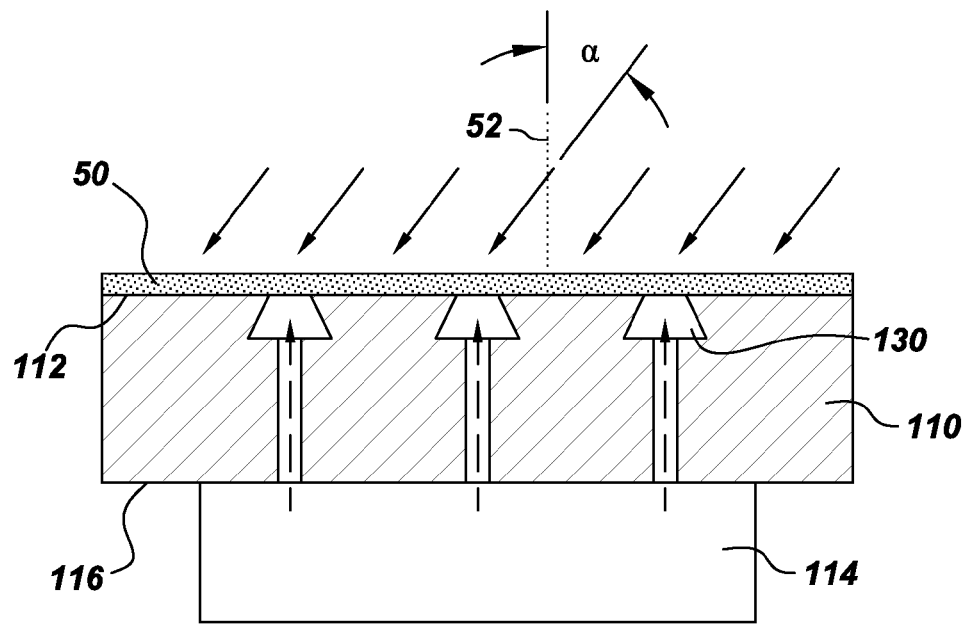
Figure 11:
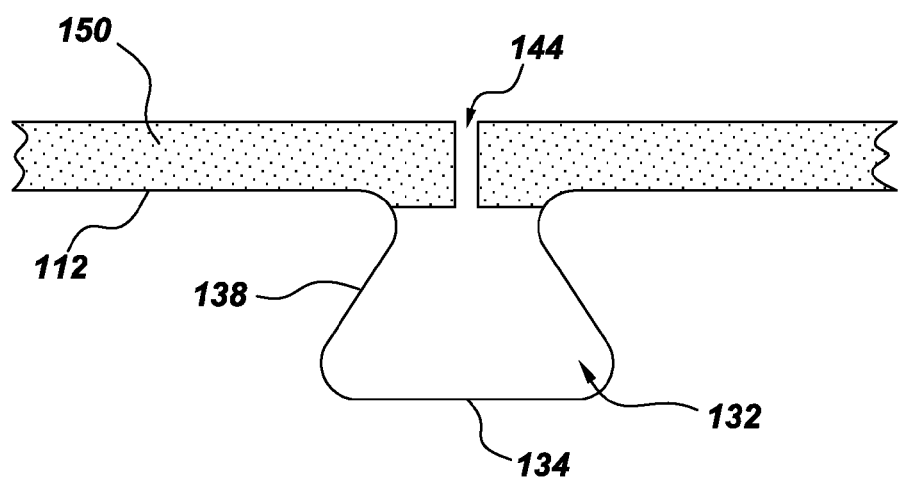

FIG. 7 schematically depicts, in cross-section, a re-entrant shaped groove with a coating extending over the top of the groove to form a re-entrant shaped channel;

FIG. 8 schematically depicts, in perspective view, three example micro-channels that extend partially along the surface of the substrate and channel coolant to respective film cooling holes;

FIG. 9 is a cross-sectional view of one of the example microchannels of FIG. 8 and shows the micro-channel conveying coolant from an access hole to a film cooling hole;

FIG. 10 illustrates the application of an angled coating technique with the re-entrant microchannels of the present invention; and FIG. 11 illustrates a coating with porous gaps for stress relief.

DETAILED DESCRIPTION OF THE INVENTION

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). In addition, the term "combination" is inclusive of blends, mixtures, alloys, reaction products, and the like.

Moreover, in this specification, the suffix "(s)" is usually intended to include both the singular and the plural of the term that it modifies, thereby including one or more of that term (e.g., "the passage hole" may include one or more passage holes, unless otherwise specified). Reference throughout the specification to "one embodiment," "another embodiment," "an embodiment," and so forth, means that a particular element (e.g., feature, structure, and/or characteristic) described in connection with the embodiment is included in at least one embodiment described herein, and may or may not be present in other embodiments. In addition, it is to be understood that the described inventive features may be combined in any suitable manner in the various embodiments.

Figure 1:
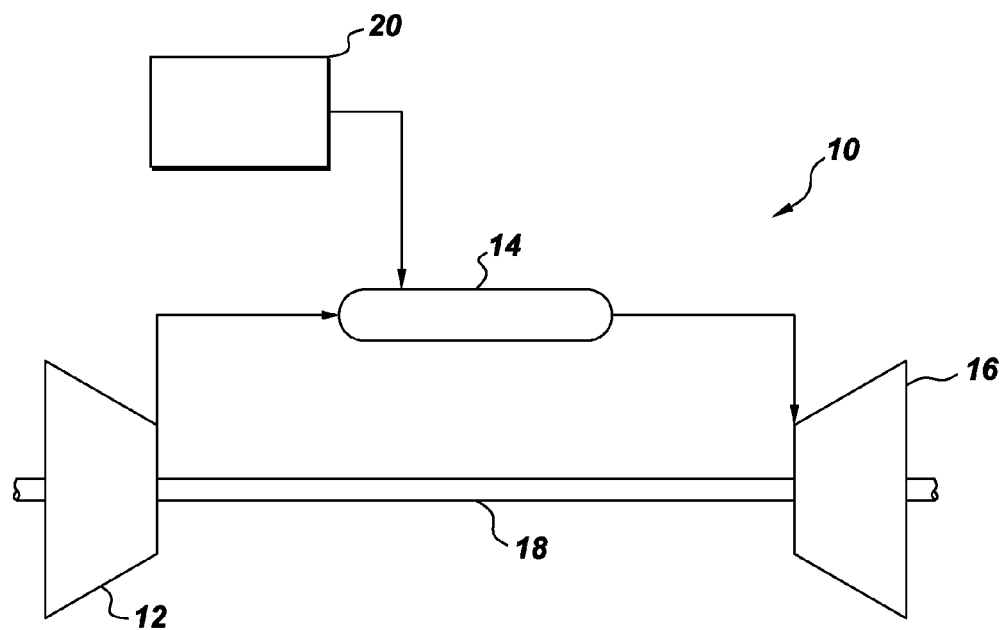
FIG. 1 is a schematic illustration of a gas turbine system.

FIG. 1 is a schematic diagram of a gas turbine system 10. The system 10 may include one or more compressors 12, combustors 14, turbines 16, and fuel nozzles 20. The compressor 12 and turbine 16 may be coupled by one or more shaft 18. The shaft 18 may be a single shaft or multiple shaft segments coupled together to form shaft 18.

The gas turbine system 10 may include a number of hot gas path components 100. A hot gas path component is any component of the system 10 that is at least partially exposed to a high temperature flow of gas through the system 10. For example, bucket assemblies (also known as blades or blade assemblies), nozzle assemblies (also known as vanes or vane assemblies), shroud assemblies, transition pieces, retaining rings, and compressor exhaust components are all hot gas path components. However, it should be understood that the hot gas path component 100 of the present invention is not limited to the above examples, but may be any component that is at least partially exposed to a high temperature flow of gas. Further, it should be understood that the hot gas path component 100 of the present disclosure is not limited to components in gas turbine systems 10, but may be any piece of machinery or component thereof that may be exposed to high temperature flows.

When a hot gas path component 100 is exposed to a hot gas flow 80, the hot gas path component 100 is heated by the hot gas flow 80 and may reach a temperature at which the hot gas path component 100 fails. Thus, in order to allow system 10 to operate with hot gas flow 80 at a high temperature, increasing the efficiency and performance of the system 10, a cooling system for the hot gas path component 100 is required.

In general, the cooling system of the present disclosure includes a series of small channels, or microchannels, formed in the surface of the hot gas path component 100. The hot gas path component may be provided with a coating. A cooling fluid may be provided to the channels from a plenum, and the cooling fluid may flow through the channels, cooling the coating.

A method of fabricating a component 100 is described with reference to FIGS. 2-11. As indicated, for example, in FIGS. 3-6, the method includes forming one or more grooves 132 in a surface 112 of a substrate 110. For the illustrated examples, multiple grooves 132 are formed in the substrate 110. As indicated, for example, in FIG. 2, the substrate 110 has at least one hollow interior space 114. As indicated, for example, in FIGS. 8 and 9, each of the grooves 132 extends at least partially along the surface 112 of the substrate 110. As shown, for example, in FIG. 6, each of the grooves 132 has a base 134 and a top 136, where the base 134 is wider than the top 136, such that each of the grooves 132 comprises a re-entrant shaped groove 132. For the examples shown in FIGS. 8 and 9, the grooves convey fluid to exiting film holes 142. However, other configurations do not entail a film hole, with the microchannels simply extending along the substrate surface 112 and exiting off an edge of the component, such as the trailing edge or the bucket tip, or an endwall edge. In addition, it should be noted that although the film holes are shown in FIG. 8 as being round, this is simply a non-limiting example. The film holes may also be non-circular shaped holes.

Figure 6:
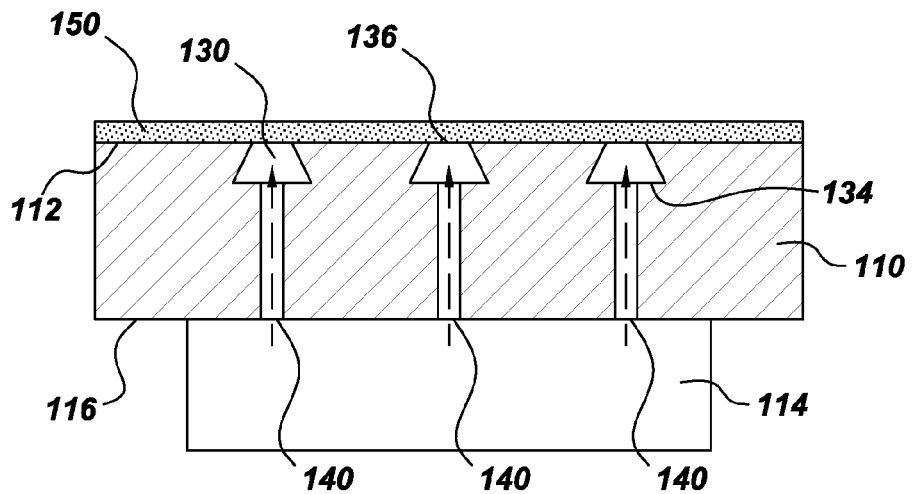
FIG. 6 is a schematic cross-section of a portion of a cooling circuit with re-entrant cooling channels.

As indicated, for example, in FIG. 6, the method further includes forming one or more access holes 140 through the base 134 of a respective one of the grooves 132, to provide fluid communication between the grooves 132 and the one hollow interior space(s) 114. The access holes 140 are typically circular or oval in cross-section and may be formed, for example using on or more of laser machining (laser drilling), abrasive liquid jet, electric discharge machining (EDM) and electron beam drilling. The access holes 140 may be normal to the base 134 of the respective grooves 132 (as shown in FIG. 6) or, more generally, may be drilled at angles in a range of 20-90 degrees relative to the base 134 of the groove. As indicated, for example, in FIG. 6, the method further includes disposing a coating 150 over at least a portion of the surface 112 of the substrate 110. More particularly, the coating 150 is deposited over at least a portion of the surface 112 of the substrate 110 directly over open ones of the grooves 132. As used here, "open" means that the grooves 132 are empty, i.e. they are not filled with a sacrificial filler. As shown in FIG. 6, for example, the grooves 132 and the coating 150 define a number of re-entrant shaped channels 130 for cooling the component 100. As indicated in FIGS. 8 and 9, for example, the substrate 110 and coating 150 may further define a plurality of exit film holes 142. For the example configuration shown in FIG. 9, the micro-channel 130 conveys coolant from an access hole 140 to a film cooling hole 142. Example coatings 150 are provided in U.S. Pat. No. 5,640,767 and U.S. Pat. No. 5,626,462, which are incorporated by reference herein in their entirety. As discussed in U.S. Pat. No. 5,626,426, the coatings 150 are bonded to portions of the surface 112 of the substrate 110.

The substrate 110 is typically cast prior to forming the grooves 132 in the surface 112 of the substrate 110. As discussed in commonly assigned U.S. Pat. No. 5,626,462, which is incorporated by reference herein in its entirety, substrate 110 may be formed from any suitable material, described herein as a first material. Depending on the intended application for component 100, this could include Ni-base, Co-base and Fe-base superalloys. The Ni-base superalloys may be those containing both γ and γ' phases, particularly those Ni-base superalloys containing both γ and γ' phases wherein the γ' phase occupies at least 40% by volume of the superalloy. Such alloys are known to be advantageous because of a combination of desirable properties including high temperature strength and high temperature creep resistance. First material may also comprise a NiAl intermetallic alloy, as these alloys are also known to possess a combination of superior properties including high temperature strength and high temperature creep resistance that are advantageous for use in turbine engine applications used for aircraft. In the case of Nb-base alloys, coated Nb-base alloys having superior oxidation resistance will be preferred, such as Nb/Ti alloys, and particularly those alloys comprising Nb-(27-40)Ti-(4.5-10.5)Al-(4.5-7.9)Cr-(1.5-5.5) Hf-(0-6)V in an atom percent. First material may also comprise a Nb-base alloy that contains at least one secondary phase, such as an Nb-containing intermetallic compound, a Nb-containing carbide or a Nb-containing boride. Such alloys are analogous to a composite material in that they contain a ductile phase (i.e. the Nb-base alloy) and a strengthening phase (i.e. a Nb-containing intermetallic compound, a Nb containing carbide or a Nb-containing boride).

Figure 2:
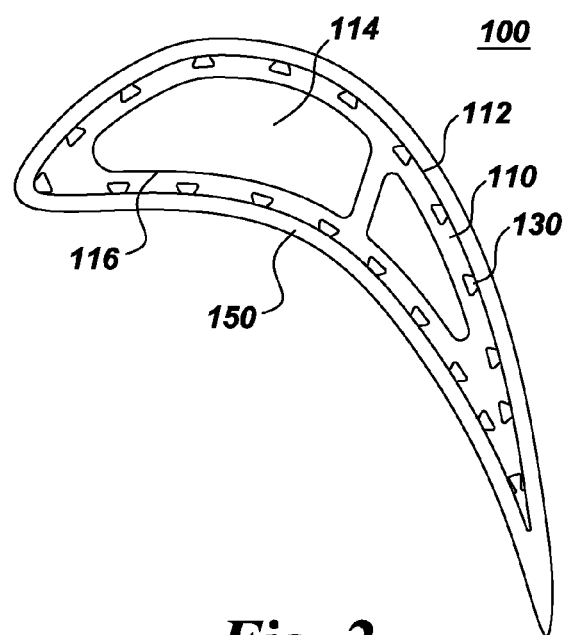
FIG. 2 is a schematic cross-section of an example airfoil configuration with re-entrant cooling channels, in accordance with aspects of the present invention.

For the example arrangement illustrated in FIGS. 2, 8 and 9, coating 150 extends longitudinally along airfoil-shaped outer surface 112 of substrate 110. Coating 150 conforms to airfoil-shaped outer surface 112 and covers grooves 132 forming channels 130. It should be noted that as depicted, coating 150 is just the first coating or structural coating that covers the channels. For certain applications, a single coating may be all that is used. However, for other applications, a bondcoat and a thermal barrier coating (TBC) are also used. For the example arrangements illustrated in FIGS. 8 and 9, the channels 130 channel the cooling flow from the respective access hole 140 to the exiting film hole 142. Typically, the channel length is in the range of 10 to 1000 times the film hole diameter, and more particularly, in the range of 20 to 100 times the film hole diameter. Beneficially, the channels 130 can be used anywhere on the surfaces of the components (airfoil body, lead edges, trail edges, blade tips, endwalls, platforms). In addition, although the channels are shown as having straight walls, the channels 130 can have any configuration, for example, they may be straight, curved, or have multiple curves, etc. Coating 150 comprises a second material, which may be any suitable material and is bonded to the airfoil-shaped outer surface 120 of substrate 110. For particular configurations, the coating 150 has a thickness in the range of 0.1-2.0 millimeters, and more particularly, in the range of 0.1 to 1 millimeters, and still more particularly 0.1 to 0.5 millimeters for industrial components. For aviation components, this range is typically 0.1 to 0.25 millimeters. However, other thicknesses may be utilized depending on the requirements for a particular component 100.

The coating 150 may be deposited using a variety of techniques. For particular processes, the coating 150 is disposed over at least a portion of the surface 112 of the substrate 110 by performing an ion plasma deposition. Example cathodic arc ion plasma deposition apparatus and method are provided in commonly assigned, U.S. Published Patent Application No. 20080138529, Weaver et al, "Method and apparatus for cathodic arc ion plasma deposition," which is incorporated by reference herein in its entirety. Briefly, ion plasma deposition comprises placing a cathode formed of a coating material into a vacuum environment within a vacuum chamber, providing a substrate 110 within the vacuum environment, supplying a current to the cathode to form a cathodic arc upon a cathode surface resulting in erosion or evaporation of coating material from the cathode surface, and depositing the coating material from the cathode upon the substrate surface 112.

In one non-limiting example, the ion plasma deposition process comprises a plasma vapor deposition process. Non-limiting examples of the coating 150 include metal coatings, bond coatings and thermal barrier coatings, as discussed in greater detail below with reference to U.S. Pat. No. 5,626,462. For certain hot gas path components 100, the coating 150 comprises a superalloy. For example, where the first material of substrate 110 is a Ni-base superalloy containing both γ and γ' phases, coating 150 may comprise these same materials, as discussed in greater detail below with reference to U.S. Pat. No. 5,626,462.

For other process configurations, the coating 150 is disposed over at least a portion of the surface 112 of the substrate 110 by performing a thermal spray process. For example, the thermal spray process may comprise high velocity oxygen fuel spraying (HVOF) or high velocity air fuel spraying (HVAF). In one non-limiting example, a NiCrAlY coating is deposited by HVOF or HVAF. For other example process configurations, a low pressure plasma spray (LPPS) process may be employed.

More generally, and as discussed in U.S. Pat. No. 5,626,462, the second material used to form coating 150 comprises any suitable material. For the case of a cooled turbine component 100, the second material must be capable of withstanding temperatures of about 1150° C., while the TBC can go to about 1320° C. The coating 150 must be compatible with and adapted to be bonded to the airfoil-shaped outer surface 112 of substrate 110. This bond may be formed when the coating 150 is deposited onto substrate 110. This bonding may be influenced during the deposition by many parameters, including the method of deposition, the temperature of the substrate 110 during the deposition, whether the deposition surface is biased relative to the deposition source, and other parameters. Bonding may also be affected by subsequent heat treatment or other processing. In addition, the surface morphology, chemistry and cleanliness of substrate 110 prior to the deposition can influence the degree to which metallurgical bonding occurs. In addition to forming a strong metallurgical bond between coating 150 and substrate 110, it is desirable that this bond remain stable over time and at high temperatures with respect to phase changes and interdiffusion, as described herein. By compatible, it is preferred that the bond between these elements be thermodynamically stable such that the strength and ductility of the bond do not deteriorate significantly over time (e.g. up to 3 years) by interdiffusion or other processes, even for exposures at high temperatures on the order of 1,150° C., for Ni-base alloy airfoil support walls 40 and Ni-base airfoil skins 42, or higher temperatures on the order of 1,300° C. in the case where higher temperature materials are utilized, such as Nb-base alloys.

As discussed in U.S. Pat. No. 5,626,462, where the first material of substrate 110 is an Ni-base superalloy containing both γ and γ' phases or a NiAl intermetallic alloy, second materials for coating 150 may comprise these same materials. Such a combination of coating 150 and substrate 110 materials is preferred for applications such as where the maximum temperatures of the operating environment similar to those of existing engines (e.g. below 1650° C.). In the case where the first material of substrate 110 is an Nb-base alloys, second materials for coating 150 may also comprise an Nb-base alloy, including the same Nb-base alloy.

As discussed in U.S. Pat. No. 5,626,462, for other applications, such as applications that impose temperature, environmental or other constraints that make the use of a metal alloy coating 150 undesirable, it is preferred that coating 150 comprise materials that have properties that are superior to those of metal alloys alone, such as composites in the general form of intermetallic compound ($I_S$)/metal alloy (M) phase composites and intermetallic compound ($I_S$)/intermetallic compound ($I_M$) phase composites. Metal alloy M may be the same alloy as used for airfoil support wall 40, or a different material, depending on the requirements of the airfoil. These composites are generally speaking similar, in that they combine a relatively more ductile phase M or $I_M$ with a relatively less ductile phase $I_s$, in order to create a coating 150 that gains the advantage of both materials. Further, in order to have a successful composite, the two materials must be compatible. As used herein in regard to composites, the term compatible means that the materials must be capable of forming the desired initial distribution of their phases, and of maintaining that distribution for extended periods of time as described above at use temperatures of 1,150° C. or more, without undergoing metallurgical reactions that substantially impair the strength, ductility, toughness, and other important properties of the composite. Such compatibility can also be expressed in terms of phase stability. That is, the separate phases of the composite must have a stability during operation at temperature over extended periods of time so that these phases remain separate and distinct, retaining their separate identities and properties and do not become a single phase or a plurality of different phases due to interdiffusion. Compatibility can also be expressed in terms of morphological stability of the interphase boundary interface between the $I_S/M$ or $I_S/I_M$ composite layers. Such instability may be manifested by convolutions, which disrupt the continuity of either layer. It is also noted that within a given coating 150, a plurality of $I_S/M$ or $I_S/I_M$ composites may also be used, and such composites are not limited to two material or two phase combinations. The use of such combinations are merely illustrative, and not exhaustive or limiting of the potential combinations. Thus $M/I_M/I_S$, $M/I_{S1}/I_{S2}$ (where $I_{S1}$ and $I_{S2}$ are different materials) and many other combinations are possible.

As discussed in U.S. Pat. No. 5,626,462, where substrate 110 comprises a Ni-base superalloy comprising a mixture of both γ and γ' phases, $I_S$ may comprise $Ni_3$ [Ti, Ta, Nb, V], NiAl, $Cr_3Si$, [Cr, Mo]$_X$Si, [Ta, Ti, Nb, Hf, Zr, V]C, $Cr_3C_2$ and $Cr_7C_3$ intermetallic compounds and intermediate phases and M may comprise a Ni-base superalloy comprising a mixture of both γ and γ' phases. In Ni-base superalloys comprising a mixture of both γ and γ' phases, the elements Co, Cr, Al, C and B are nearly always present as alloying constituents, as well as varying combinations of Ti, Ta, Nb, V, W, Mo, Re, Hf and Zr. Thus, the constituents of the exemplary $I_S$ materials described correspond to one or more materials typically found in Ni-base superalloys as may be used as first material (to form the substrate 110), and thus may be adapted to achieve the phase and interdiffusional stability described herein. As an additional example in the case where the first material (the substrate 110) comprises NiAl intermetallic alloy, $I_S$ may comprise $Ni_3$ [Ti, Ta, Nb, V], NiAl, $Cr_3Si$, [Cr, Mo]$_X$Si, [Ta, Ti, Nb, Hf, Zr, V]C, $Cr_3C_2$ and $Cr_7C_3$ intermetallic compounds and intermediate phases and $I_M$ may comprise a $Ni_3Al$ intermetallic alloy. Again, in NiAl intermetallic alloys, one or more of the elements Co, Cr, C and B are nearly always present as alloying constituents, as well as varying combinations of Ti, Ta, Nb, V, W, Mo, Re, Hf and Zr. Thus, the constituents of the exemplary $I_S$ materials described correspond to one or more materials typically found in NiAl alloys as may be used as first material, and thus may be adapted to achieve the phase and interdiffusional stability described herein.

As discussed in U.S. Pat. No. 5,626,462, where substrate 110 comprises a Nb-base alloy, including a Nb-base alloy containing at least one secondary phase, $I_S$ may comprise a Nb-containing intermetallic compound, a Nb-containing carbide or a Nb-containing boride, and M may comprise a Nb-base alloy. It is preferred that such $I_S/M$ composite comprises an M phase of an Nb-base alloy containing Ti such that the atomic ratio of the Ti to Nb (Ti/Nb) of the alloy is in the range of 0.2-1, and an $I_S$ phase comprising a group consisting of Nb-base silicides, $Cr_2$ [Nb, Ti, Hf], and Nb-base aluminides, and wherein Nb, among Nb, Ti and Hf, is the primary constituent of $Cr_2$ [Nb, Ti, Hf] on an atomic basis. These compounds all have Nb as a common constituent, and thus may be adapted to achieve the phase and interdiffusional stability described in U.S. Pat. No. 5,626,462.

The as-applied coating has sufficient particle size, strength, and adhesion (bonding) to bridge the opening gaps 136 of the re-entrant grooves 132 with minimal amounts of coating material being deposited inside the groove. However, typically, some coating material will also fill-in the opening slightly below the outer surface, as indicated in FIG. 7, for example. This bridging effect has been documented previously with plasma vapor deposition (PVD) TBC coatings deposited over small sized open grooves. Beneficially, use of the present re-entrant micro-channel technique, with thermal spray coatings results in much larger particle agglomerations with the ability to bridge larger gap 136 sizes.

In addition to coating system 150, the interior surface of the groove 132 (or of the micro-channel 130, if the first (inner) layer of coating 150 is not particularly oxidation-resistant) can be further modified to improve its oxidation and/or hot corrosion resistance. Suitable techniques for applying an oxidation-resistant coating (not expressly shown) to the interior surface of the grooves 132 (or of the micro-channels 130) include vapor-phase or slurry chromiding, vapor-phase or slurry aluminizing, or overlay deposition via evaporation, sputtering, ion plasma deposition, thermal spray, and/or cold spray. Example oxidation-resistant overlay coatings include materials in the MCrAlY family (M={Ni, Co, Fe}) as well as materials selected from the NiAlX family (X={Cr, Hf, Zr, Y, La, Si, Pt, Pd}).

Figure 3:
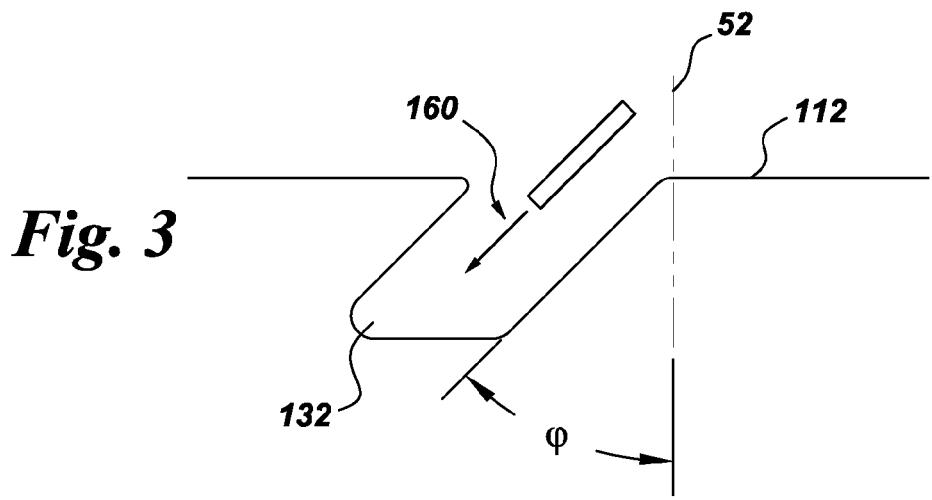
FIG. 3 illustrates a first pass of an abrasive liquid jet at an angle φ for forming a re-entrant groove.
Figure 4:
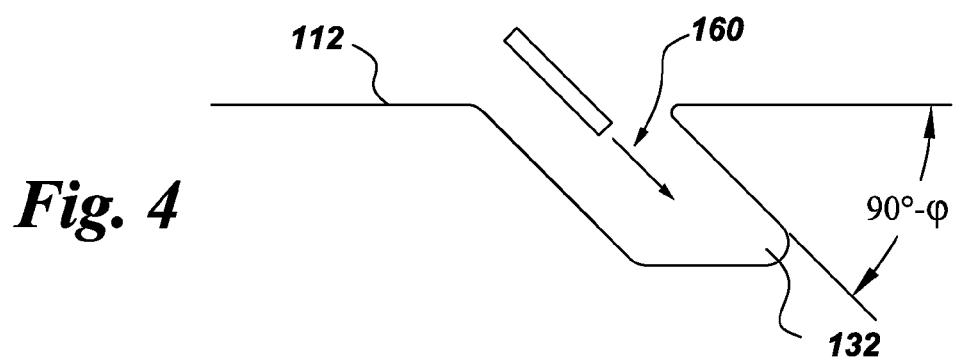
FIG. 4 illustrates a second pass of the abrasive liquid jet at an opposite angle 180-φ for forming the re-entrant groove.
Figure 5:
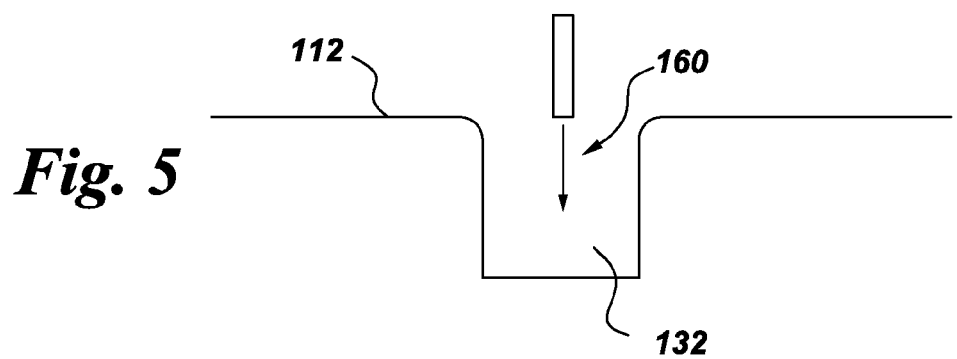
FIG. 5 illustrates an optional third pass of the abrasive liquid jet normal to the groove, for forming the re-entrant groove.

Referring now to FIGS. 3-5, the re-entrant shaped grooves 132 may be formed using a variety of techniques. For example, the re-entrant shaped grooves 132 may be formed using one or more of an abrasive liquid jet, plunge electrochemical machining (ECM), electric discharge machining (EDM) with a spinning single point electrode ("milling" EDM) and laser machining (laser drilling). Example laser machining techniques are described in commonly assigned, U.S. patent application Ser. No. 12/697,005, "Process and system for forming shaped air holes" filed Jan. 29, 2010, which is incorporated by reference herein in its entirety. Example EDM techniques are described in commonly assigned U.S. patent application Ser. No. 12/790,675, "Articles which include chevron film cooling holes, and related processes," filed May 28, 2010, which is incorporated by reference herein in its entirety.

For particular process configurations, the re-entrant shaped grooves 132 are formed by directing an abrasive liquid jet 160 at the surface 112 of the substrate 110, as schematically depicted in FIGS. 3-5. Other tool path configurations for the jet 160 may also be used. For example, the jet 160 may be swept along a radius (FIG. 5) and moved along the channel length direction following a zig-zag tool path In this manner, a relatively narrow groove opening 136 (top of the groove) may be formed. In order to sweep the jet 160, a multi-axis numerically controlled (NC) tool path function may be employed to control the pivot point for the jet 160, to ensure a narrow opening of 136. The depth of the channel is determined by the sweeping speed, as well as the jet travel speed along the channel when the jet pressure is set. Example water jet drilling processes and systems are provided in U.S. patent application Ser. No. 12/790,675. As explained in U.S. patent application Ser. No. 12/790,675, the water jet process typically utilizes a high-velocity stream of abrasive particles (e.g., abrasive "grit"), suspended in a stream of high pressure water. The pressure of the water may vary considerably, but is often in the range of about 5,000-90,000 psi. A number of abrasive materials can be used, such as garnet, aluminum oxide, silicon carbide, and glass beads. Beneficially, the water jet process does not involve heating of the substrate 110 to any significant degree. Therefore, there is no "heat-affected zone" formed on the substrate surface 112, which could otherwise adversely affect the desired exit geometry for the re-entrant shaped grooves 132.

In addition, and as explained in U.S. patent application Ser. No. 12/790,675, the water jet system can include a multi-axis computer numerically controlled (CNC) unit. The CNC systems themselves are known in the art, and described, for example, in U.S. Patent Publication 2005/0013926 (S. Rutkowski et al), which is incorporated herein by reference. CNC systems allow movement of the cutting tool along a number of X, Y, and Z axes, as well as rotational axes.

As indicated for example in FIGS. 3 and 4, for particular process configurations, the re-entrant shaped grooves 132 are formed by directing the abrasive liquid jet 160 at a lateral angle relative to the surface 112 of the substrate 110 in a first pass of the abrasive liquid jet 160 and then making a subsequent pass at an angle substantially opposite to that of the lateral angle. FIG. 3 illustrates an example cut made with an abrasive water jet at an example lateral angle φ relative to the surface normal of surface 112 of the substrate 110. For particular configurations, a wall 138 (see FIG. 7, for example) of a respective one of the re-entrant shaped grooves 132 is oriented at an angle φ in a range of about 10-89 degrees relative to a surface normal 52, and more particularly at an angle φ in a range of about 20-70 degrees relating to the surface normal 52, and still more particularly, at an angle φ in a range of about 20-45 degrees relative to the surface normal 52. Although the wall 138 is shown as being a straight wall in FIG. 7, the wall 138 may also be curved. In the case of a curved wall 138, the angle φ should be understood to be the average angle for the curved wall. Similarly, FIG. 4 illustrates an example cut made with an abrasive water jet at an angle substantially opposite to that (namely, 90°-φ+/−10°, where the lateral angle φ is defined relative to the surface normal 52, as shown in FIG. 3, and where the opposite angle is defined relative to the surface 112, as indicated in FIG. 4) of the lateral angle shown in FIG. 3. In addition, and as shown in FIG. 5, the step of forming the re-entrant shaped grooves 132 may further comprise performing an additional pass where the abrasive liquid jet 160 is directed toward the base 134 of the groove 132 at one or more angles between the lateral angle and a substantially opposite angle, such that material is removed from the base 134 of the groove 132.

To facilitate the deposition of coating 150 over the groove 132 without having the coating fill the groove 132, it is desirable to have the base 134 of the groove 132 be considerable larger than the top 136 of the groove. This also permits the formation of a sufficiently large micro-channel 130 to meet the cooling requirements for the component 100. For particular configurations, the base 134 of a respective one of the re-entrant shaped grooves 132 is at least 2 times wider than the top 136 of the respective groove 132. For example, if the base 134 of the groove 132 is 0.75 millimeters, the top 136 would be less than 0.375 millimeters in width, for this configuration. For more particular configurations, the base 134 of the respective re-entrant shaped groove 132 is at least 3 times wider than the top 136 of the respective groove 132, and still more particularly, the base 134 of the respective re-entrant shaped groove 132 is in a range of about 3-4 times wider than the top 136 of the respective groove 132. Beneficially, a large base to top ratio increases the overall cooling volume for the micro-channel 130, while facilitating the deposition of the coating 150 over the groove 132 without having the coating 150 fill the groove 132.

Beneficially, by forming re-entrant grooves 132, it is not necessary to use a sacrificial filler (not shown) to apply coating 150 to the substrates 110. This eliminates the need for a filling process and for the more difficult removal process. By forming reentrant shaped grooves with narrow openings 136 (tops), for example with openings 136 in the range of about 10-12 mils wide, the openings 136 can be bridged by the coating 150 without the use of a sacrificial filler, thereby eliminating two of the main processing steps (filling and leaching) for conventional channel forming techniques. For the example configuration illustrated in FIG. 7, the coating 150 completely bridges the respective grooves 132, such that the coating 150 seals the respective microchannels 130. FIG. 11 illustrates another arrangement, where the coating 150 defines one or more porous gaps 144 (for example, porosity in the coating 150 or a gap in the coating), such that the coating 150 does not completely bridge each of the respective grooves 132. Although FIG. 11 schematically depicts the gap 144 as having a uniform and straight geometry, typically gap 144 has an irregular geometry, with the width of the gap 144 varying, as the coating 150 is applied and builds up a thickness. Initially, as the first part of the coating 150 is applied to the substrate 110, the width of the gap 144 may be as much as 50% of the width of the top 136 of the micro-channel 130. The gap 144 may then narrow down to 5% or less of the width of the top 136, as the coating 150 is built up. For particular examples, the width of gap 144, at its narrowest point, is 5% to 20% of the width of the respective micro-channel top 136. In addition, the gap 144 may be porous, in which case the "porous" gap 144 may have some connections, that is some spots or localities that have zero gap. Beneficially, the gaps 144 provide stress relief for the coating 150.

A component 100 is described with reference to FIGS. 2 and 6-9. As indicated, for example, in FIG. 2, the component 100 comprises a substrate 110 with an outer surface 112 and an inner surface 116. As indicated, for example, in FIG. 2, the inner surface 116 of the substrate 110 defines at least one hollow, interior space 114. As indicated, for example, in FIGS. 2, 6 and 8, the outer surface 112 of the substrate 110 defines a number of grooves 132. As indicated, for example, in FIGS. 6, 8 and 9, each of the grooves 132 extends at least partially along the surface 112 of the substrate 110 and has a base 134 and a top 136. As indicated, for example, in FIG. 6, the base 134 of a respective groove 132 is wider than the top 136 of the respective groove 132, such that each of the grooves 132 comprises a re-entrant shaped groove 132. Access holes 140 extend through the respective bases 134 of the grooves 132 to provide fluid communication between the grooves 132 and the hollow interior space(s) 114, as shown for example in FIG. 6. As discussed above, the access holes 140 may be normal to the base 134 of the respective grooves 132 (as shown in FIG. 6) or may be drilled at angles in a range of 20-90 degrees relative to the base 134 of the groove 132.

As indicated in FIG. 6, for example, the component 100 further includes at least one coating 150 disposed over at least a portion of the surface 112 of the substrate 110, wherein the grooves 132 and the coating 150 define a number of re-entrant shaped channels 130 for cooling the component 100. For the example configuration shown in FIGS. 8 and 9, the microchannels 130 channel the cooling flow from the respective access hole 140 to the exiting film hole 142. Example ranges for microchannel lengths are provided above. As noted above, the microchannels 130 can be used anywhere on the surfaces of the components (airfoil body, lead edges, trail edges, blade tips, endwalls, platforms). In addition, although the microchannels are shown as having straight walls, the channels 130 can have any configuration, for example, they may be straight, curved, or have multiple curves, etc. Example coatings are also provided above. For the example arrangement illustrated in FIGS. 2, 8 and 9, coating 150 extends longitudinally along airfoil-shaped outer surface 112 of substrate 110. Coating 150 conforms to airfoil-shaped outer surface 112 and covers grooves 132 forming microchannels 130. Coating 150 comprises a second material, which may be any suitable material and is bonded to the airfoil-shaped outer surface 120 of substrate 110. Example thickness ranges for coating 150 are provided above. Non-limiting examples of the coating 150 include metal coatings, bond coatings and thermal barrier coatings.

As discussed above, it is desirable to have the base 134 of the groove 132 be considerable larger than the top 136 of the groove, in order to deposit the coating 150 over the groove 132 without having the coating fill the groove 132. This further permits the formation of a sufficiently large microchannel 130 to meet the cooling requirements for the component 100. For particular configurations, the base 134 of a respective one of the re-entrant shaped grooves 132 is at least 2 times wider than the top 136 of the respective groove 132. More particularly, the base 134 of the respective re-entrant shaped groove 132 is in a range of about 3-4 times wider than the top 136 of the respective groove 132.

Similarly, for particular configurations, a wall 138 (see, for example FIG. 7) of a respective one of the re-entrant shaped grooves 132 is oriented at an angle φ (see, for example, FIG. 3) in a range of about 10-89 degrees relative to the surface normal 52. More particularly, the wall 138 of the respective one of the re-entrant shaped grooves 132 is oriented at an angle φ in a range of about 20-45 degrees relative to the surface normal 52. As noted above, the groove walls 138 may be straight, as shown for example in FIG. 7, or may be curved (not shown). For curved walls 138, the angle φ should be understood to be the average angle φ for the curved wall 138. For certain configurations of the component 100, the coating 150 completely bridges the respective grooves 132, as shown for example in FIG. 7, such that the coating 150 seals the respective microchannels 130. For other configurations of component 100, the coating 150 defines one or more porous gaps 144, as indicated in FIG. 11, such that the coating 150 does not completely bridge each of the respective grooves 132. Beneficially, the porous gaps 144 provide stress relief for the coating 150.

A method of coating a component 100 without the use of a sacrificial filler is described with reference to FIGS. 2-9 and 11. As indicated, for example in FIGS. 3-6, the method includes forming a number of grooves 132 in a surface 112 of a substrate 110. Although FIGS. 3-6 illustrate the formation of re-entrant shaped grooves 132, for other configurations (not expressly illustrated) the grooves are simple grooves (namely, with tops 136 and bases of approximately equal width). As indicated, for example in FIGS. 2 and 6, the substrate 110 has at least one hollow interior space 114. As indicated, for example, in FIG. 8 each of the grooves 132 extends at least partially along the surface 112 of the substrate 110. In order to apply the coating 150 without the use of a sacrificial filler, the top 136 is typically about 0.1 mm to 0.5 mm, and more particularly, about 0.2 mm to 0.35 mm, in width.

As indicated in FIG. 10, for the case of an angled deposition, the method of coating a component 100 without the use of a sacrificial filler further includes disposing a coating 150 over at least a portion of the surface 112 of the substrate 110 directly over open ones of the grooves 132. As used here, "open" means that the grooves 132 are empty, i.e. they are not filled with a sacrificial filler. As indicated in FIG. 6, for the case of re-entrant grooves, the grooves 132 and the coating 150 define a number of channels 130 for cooling the component 100. Although these simple grooves (namely, grooves with tops 136 and bases of approximately equal width) are less effective for cooling the component than the re-entrant shaped grooves, the simple grooves still beneficially allow coating without fillers and leaching.

As discussed above, the substrate 110 is typically cast prior to forming the grooves 132 in the surface 112 of the substrate 110. As discussed above with reference to FIG. 6, the method further optionally includes forming a number of access holes 140. Each of the access holes 140 is formed through the base 134 of a respective one of the grooves 132, to connect the groove 132 in fluid communication with respective ones of the hollow interior space(s) 114. More particularly, the coating 150 comprises at least one of a metal coating, a bond coating, and a thermal barrier coating. Suitable coating deposition techniques are discussed above and include performing an ion plasma deposition, a high velocity oxygen fuel spray (HVOF) process, a high velocity air fuel spray (HVAF) process, or a low pressure plasma spray (LPPS) process.

As discussed above with reference to FIG. 7, for certain process configurations, the coating 150 completely bridges the respective grooves 132, such that the coating 150 seals the respective channels 130. As discussed above with reference to FIG. 11, for other process configurations, the coating 150 defines one or more porous gaps 144 such that the coating 150 does not completely bridge each of the respective grooves 132. Beneficially, this porous configuration provides stress relief for the coating.

The reentrant grooves 132 eliminate the need to use a sacrificial filler (not shown) and subsequent removal process. Beneficially, elimination of these two processing steps has the potential to reduce fabrication variability, flaw inclusions, and human errors. Further, the re-entrant channels 130 also enable the components 100 to be repaired without the need for filling and leaching.

In addition, the above described re-entrant grooves 132 can be used in combination with the angled coating deposition techniques provided in commonly assigned, concurrently filed, US patent application, Ronald S. Bunker et al., "Component and methods of fabricating and coating a component," corresponding to GE docket number 247894-1, which is incorporated by reference herein in its entirety. Briefly, Bunker et al. provides a method of coating a component 100 that includes depositing a coating 150 over at least a portion of the surface 112 of the substrate 110. The coating 150 comprises one or more layers 50, and at least one of the layers 50 is deposited at an angle α in a range of about 20-80 degrees, and more particularly, about 50-70 degrees, relative to a surface normal 52 for the substrate 110, as indicated for example in FIG. 10. Beneficially, by applying the coating at a significant deposition angle, the coating can bridge over the groove 132 without filling or partial filling.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of fabricating a component, the method comprising: forming one or more grooves in a surface of a substrate, wherein the substrate has at least one hollow interior space, wherein each of the one or more grooves extends at least partially along the surface of the substrate and has a base and a top, wherein the base is wider than the top such that each of the one or more grooves comprises a re-entrant shaped groove; forming one or more access holes through the base of a respective one of the one or more grooves, to connect the groove in fluid communication with respective ones of the at least one hollow interior space; and disposing a coating over at least a portion of the surface of the substrate, wherein the one or more grooves and the coating define one or more re-entrant shaped channels for cooling the component; wherein the one or more re-entrant shaped grooves are formed by directing an abrasive liquid jet at the surface of the substrate; wherein the one or more re-entrant shaped grooves are formed by directing the abrasive liquid jet at a lateral angle relative to the surface of the substrate in a first pass of the abrasive liquid jet and then making a subsequent pass at an angle substantially opposite to that of the lateral angle.

2. The method of claim 1, further comprising casting the substrate prior to forming the one or more grooves in the surface of the substrate.

3. The method of claim 1, wherein the step of forming the one or more re-entrant shaped grooves further comprises performing at least one additional pass where the abrasive liquid jet is directed toward the base of the groove at one or more angles between the lateral angle and the substantially opposite angle, such that material is removed from the base of the groove.

4. The method of claim 1, wherein the base of a respective one of the one or more re-entrant shaped grooves is at least 2 times wider than the top of the respective groove.

5. The method of claim 4, wherein the base of the respective re-entrant shaped groove is at least 3 times wider than the top of the respective groove.

6. The method of claim 5, wherein the base of the respective re-entrant shaped groove is in a range of about 3-4 times wider than the top of the respective groove.

7. The method of claim 1, wherein a wall of a respective one of the one or more re-entrant shaped grooves is oriented at an angle $\phi$ in a range of about 10-89 degrees relative to a surface normal.

8. The method of claim 7, wherein the wall of the respective one of the one or more re-entrant shaped grooves is oriented at the angle $\phi$ in a range of about 20-45 degrees relative to the surface normal.

9. The method of claim 1, wherein disposing a coating over at least the portion of the surface of the substrate comprises performing an ion plasma deposition.

10. The method of claim 9, wherein the coating comprises a superalloy.

11. The method of claim 1, wherein disposing a coating over at least the portion of the surface of the substrate comprises performing a thermal spray process.

12. The method of claim 11, wherein the thermal spray process comprises high velocity oxygen fuel spraying (HVOF) or high velocity air fuel spraying (HVAF).

13. The method of claim 1, wherein disposing a coating over at least the portion of the surface of the substrate comprises performing a low pressure plasma spray (LPPS) process.

14. The method of claim 1, wherein the one or more re-entrant shaped grooves (132) are formed using one or more of an abrasive liquid jet, plunge electrochemical machining (ECM), electric discharge machining (EDM) with a spinning electrode (milling EDM) and laser machining.

15. The method of claim 1, wherein the coating completely bridges the respective one or more grooves such that the coating seals the respective one or more channels.

16. The method of claim 1, wherein the coating defines one or more porous gaps such that the coating does not completely bridge each of the respective one or more grooves.

* * * * *